United States Patent
Wu et al.

(10) Patent No.: US 7,702,490 B1
(45) Date of Patent: Apr. 20, 2010

(54) METHOD AND SYSTEM FOR ADAPTIVE MESH-FREE SHELL STRUCTURES

(75) Inventors: Cheng-Tang Wu, Livermore, CA (US); Yong Guo, San Ramon, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 1395 days.

(21) Appl. No.: 11/113,552

(22) Filed: Apr. 25, 2005

Related U.S. Application Data

(63) Continuation-in-part of application No. 10/990,003, filed on Nov. 16, 2004.

(51) Int. Cl.
G06F 7/60 (2006.01)
G06F 17/10 (2006.01)
G06G 7/48 (2006.01)

(52) U.S. Cl. ............................................. 703/2; 703/6
(58) Field of Classification Search .................... 703/2, 703/6; 345/420
See application file for complete search history.

(56) References Cited

U.S. PATENT DOCUMENTS

| | | | |
|---|---|---|---|
| 5,604,891 | A | 2/1997 | Burnett et al. |
| 5,963,459 | A | 10/1999 | Burnett et al. |
| 6,718,291 | B1 | 4/2004 | Shapiro et al. |
| 6,876,956 | B1 | 4/2005 | Cirak et al. |
| 2004/0034514 | A1* | 2/2004 | Langemyr et al. ............. 703/2 |
| 2007/0165948 | A1* | 7/2007 | Laffargue et al. ........... 382/173 |

OTHER PUBLICATIONS

Shaofan Li, Wei Hao, Wing Kam Liu, Mesh-free simulations of shear banding in large deformation, International Journal of Solids and Structuresvol. 37, Issues 48-50, , Nov. 12, 2000, pp. 7185-7206.*
Kenjiro Terada, Mao Kurumatani, "An integrated procedure for three-dimensional structural analysis with the finite cover method", International Journal for Numerical Methods in Engineering, VL 63 No. 15, p. 2102-2123 Copyright © 2005 John Wiley & Sons, Ltd.*
Meagher "Efficient Synthetic Image Generationsof Arbitrary 3-D Objects", 1982 IEEE, pp. 473-478.

(Continued)

*Primary Examiner*—Kamini S Shah
*Assistant Examiner*—David Silver
(74) *Attorney, Agent, or Firm*—Roger H. Chu

(57) ABSTRACT

A method, system and computer program product pertained to adaptive discretization refinement of shell structure is disclosed. The adaptive mesh-free model is based on a technique for dividing the critical area into a finer model. The present invention is a method for enabling adaptive mesh-free shell structure in a time-domain analysis, the method comprises: defining the mesh-free shell structure by a structural geometry description file including a plurality of nodes and a reference 3-D mesh, which includes a plurality of shell elements, mapping the 3-D reference mesh into a 2-D parametric plane, wherein the 2-D parametric mesh includes a plurality of integration cells corresponding to the plurality of shell elements, solving structural responses at current solution cycle using mesh-free mathematical approximations pertaining to each of the plurality of integration cells, performing adaptive discretization refinement for the plurality of the integration cells.

21 Claims, 14 Drawing Sheets

OTHER PUBLICATIONS

USPTO—1st Office Action mailed Jun. 28, 2007 (U.S. Appl. No. 10/990,003).
Muller et al., "Point Based Animation of Elastic, Plastic and Melting Objects", 2004, SCM Eurographics, pp. 141-151.
USPTO—2nd Office Action mailed Nov. 30, 2007 (U.S. Appl. No. 10/990,003).
Applicant's Response to the 2nd Office Action (U.S. Appl. No. 10/990,003) Dec. 6, 2007.
USPTO—3rd Office Action mailed Mar. 7, 2008 (U.S. Appl. No. 10/990,003).
Applicant's Response to the 3rd Office Action (U.S. Appl. No. 10/990,003) Mar. 19, 2008.
P. Krysl, T. Belytschko, Analysis of thin shells by the element-free Galerkin method, Intl. Solids Structures Vo. 33, No. 20-22, pp. 3057-3080, 1996, Elsevier, UK.
J. Chen, C, Pan, C. Wu, W. Liu, Reproducing kernel particle methods for large deformation analysis of non-linear structures, Comp. Methods Appl. Mech. Engrg. 139, pp. 195-227, 1996, Elsevier.
F. Gunther, W. Liu, Implementation of boundary conditions for meshless methods, Comp. Methods Appl. Mech. Engrg. 163, pp. 205-230, 1998, Elsevier.
J. Meek, Y. Wang, Nonlinear static and dynamic analysis of shell structures with finite rotation, Comp. Methods Appl. Mech. Engrg. 162, pp. 301-315, 1998, Elsevier.
H. Noguchi, T. Kawashima, T. Miyamura, Element free analyses of shell and spatial structures, Int. J. Numer. Meth. Engng. 47, pp. 1215-1240, 2000, John Wiley.
J. Chen, C. Wu, S. Yoon, Y. You, A stabilized conforming nodal integration for Galerkin mesh-free methods, Int. J. Numer. Meth. Engng. 50, pp. 435-466, 2001, John Wiley.
USPTO—4th Office Action mailed Jul. 1, 2008 (U.S. Appl. No. 10/990,003).
Applicants' Response to the 4th Office Action (U.S. Appl. No. 10/990,003) Filed Sep. 10, 2008.
USPTO—Notice of Allowance mailed Jan. 14, 2009 (U.S. Appl. No. 10/990,003).

* cited by examiner

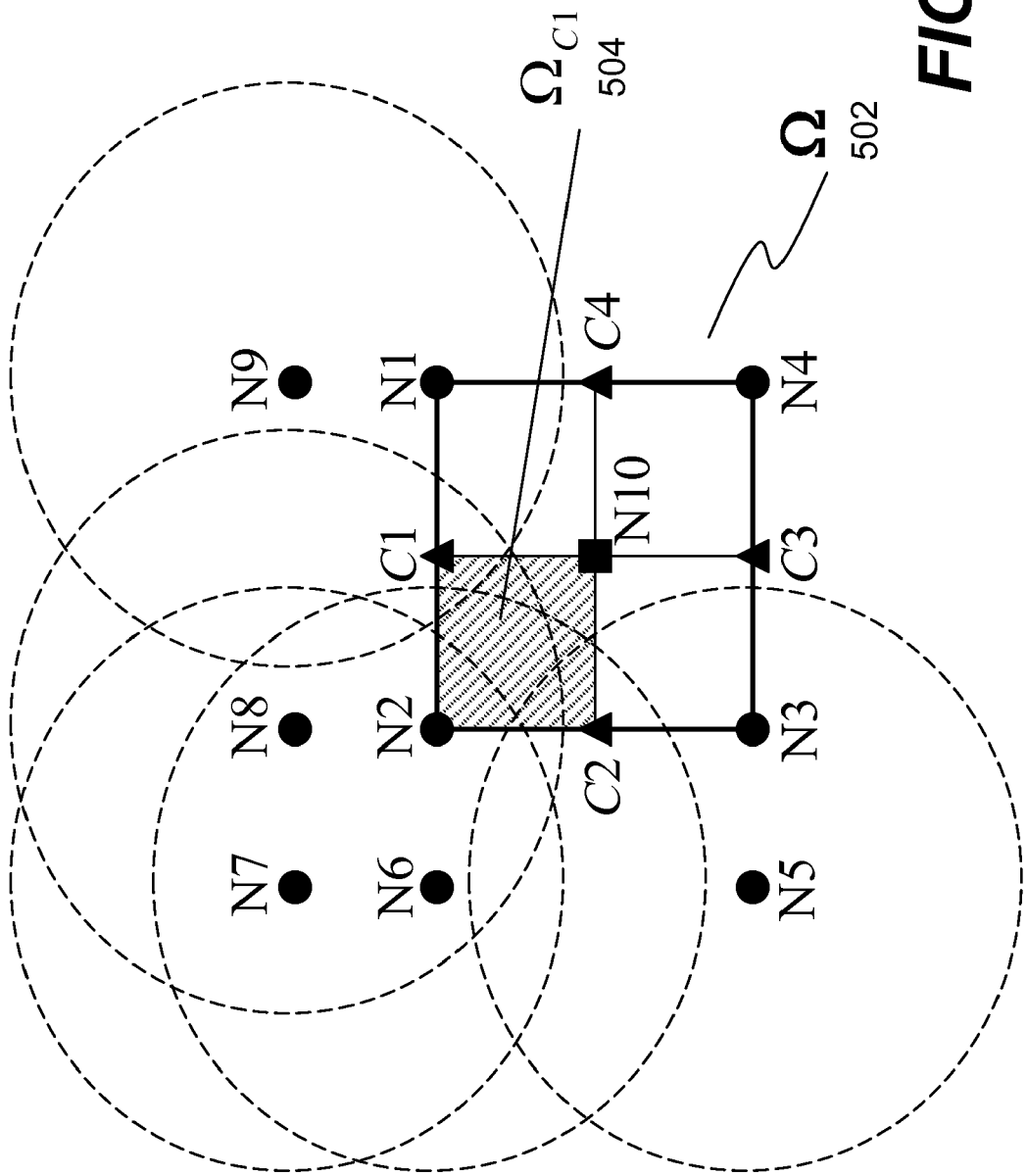

600
Process of mesh-free analysis with adaptive discretization

METHOD AND SYSTEM FOR ADAPTIVE MESH-FREE SHELL STRUCTURES

BACKGROUND OF THE INVENTION

1. Field of the Invention

The present invention generally relates to method, system and computer program product used in computer aided engineering analysis, more particularly to enabling adaptive discretization refinement for general three-dimensional (3-D) shell structures in mesh-free analysis.

2. Description of the Related Art

Finite element analysis (FEA) is a computerized method widely used in industry to model and solve engineering problems relating to complex systems since its invention in late 1950's. With the advent of the modern digital computer, FEA has been implemented as FEA computer program product. Basically, the FEA computer program product is provided with a model of the geometric description and the associated material properties at each point within the model. In this model, the geometry of the system under analysis is represented by solids, shells and beams of various sizes, which are called elements. The vertices of the elements are referred to as nodes. The individual elements are connected together by a topological map, which is usually called mesh. The model is comprised of a finite number of elements, which are assigned a material name to associate with material properties. The model thus represents the physical space occupied by the object under analysis along with its immediate surroundings. The FEA computer program product then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

FEA computer program product can be classified into two general types, implicit analysis computer program product and explicit analysis computer program product. The implicit analysis computer program product uses an implicit equation solver to solve a system of coupled linear equations. Such computer program product is generally used to simulate static or quasi-static problems. Explicit computer program product does not solve coupled equations but explicitly solves for each unknown assuming them uncoupled. The explicit analysis computer program product usually uses central difference time integration which requires very small solution cycles or time steps for the method to be stable and accurate. The explicit analysis computer program product is generally used to simulate short duration events where dynamics are important such as impact type events.

Although FEA has been successfully applied to many fields to simulate various engineering problems, there are some instances that FEA may not be advantageous due to numerical compatibility condition is not the same as the physical compatibility condition of a continuum. For example, in Lagrangian type of computations, one may experience mesh distortion, which can either end the computation altogether or result in dramatic deterioration of accuracy. In addition, the FEA often requires a very fine mesh in problems with high gradients or a distinct local character, which can be computationally expensive. For this reason, adaptive re-meshing in FEA has been developed. In the adaptive re-meshing process, only the high strain gradient portion of the structure requires mesh refinement. Hence, the simulation can be carried out with computational efficiency.

However, the FEA adaptive re-meshing procedures for simulations of impact/penetration problems, explosion/fragmentation problems, flow pass obstacles, and fluid-structure interaction problems etc., have become formidable tasks to undertake. The difficulties for employing adaptive mesh in FEA are not only re-meshing, but also mapping the state variables from the old mesh to the new mesh. In FEA, a linear adaptivity is used in the adaptive re-meshing process, which means that each of the newly adapted mesh is constraint to the original mesh surfaces. As a result of this restriction, the analytical results are often too stiff in deformation. It is evident that this process often introduces numerical errors; frequent re-mesh is not desirable. Therefore, it would be desirable to have the new improved techniques to numerically analyze a general 3-D shell structure with adaptive discretization.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In general, the present invention pertains to computer-aided engineering analysis of a general 3-D shell structure with adaptive discretization. During the 1990's, mesh-free analysis has been developed as an alternative technique to simulate the engineering problems. Instead of finite elements, the nodal responses are calculated with mathematical approximation from the surrounding nodes. The present invention employs the adaptive discretization refinement in mesh-free analysis for general 3-D shell structures. The mesh-free model is associated with a reference finite element mesh. To perform analysis, the 3-D reference mesh is mapped to a 2-D parametric plane first. Each of the finite elements in the reference mesh is projected to an integration cell. The adaptive discretization refinement is performed at each of the integration cells, whose error indicator exceeds a predetermined threshold value. The error indicator may include, but not be limited to, angle change, thickness change, strain change. The shape functions of the nodes in the integration cell after adaptive refinement are reconstructed. The nodal responses are calculated using these reconstructed shape functions. Because the nodal responses of an adaptive discretization are not constraint by the original model, more realistic simulation results are produced.

According to one aspect, the present invention is a method for enabling adaptive mesh-free shell structure in a time-domain analysis, the method comprises: defining the mesh-free shell structure by a structural geometry description file including a plurality of nodes and a reference three-dimensional (3-D) mesh, wherein the 3-D mesh includes a plurality of shell elements, mapping the 3-D reference mesh into a two-dimensional (2-D) parametric mesh, wherein the 2-D parametric mesh includes a plurality of integration cells corresponding to the plurality of shell elements, solving structural responses at current solution cycle using mesh-free mathematical approximations pertaining to each of the plurality of integration cells, incrementing current solution cycle time by a predetermined time step, and when the current solution cycle time is less than the total simulation time, performing adaptive discretization refinement for the plurality of the integration cells.

According to another aspect, the present invention further comprises: calculating an error indicator for each of the integration cells, dividing the integration cells into a first group and a second group, wherein the error indicator of each integration cells of the first group is above a threshold value and the error indicator of each integration cells of the second group is below the threshold value, skipping the adaptive discretization refinement for the second group; and refining those integration cells in the first group.

According to yet another aspect, the present invention further comprises: adding a first new independent node in centroid of each of said those integration cells; and adding a plurality of constraint nodes to mid-point of each side of said those integration cells.

One of the objects, features, and advantages of the present invention is to be capable of efficiently analyzing a general 3-D shell structure with adaptive discretization using the mesh-free analysis basing on processing only those integration cells whose error indicator exceeds a predetermined threshold value. Another advantage of the present invention is to produce a realistic analytical result owing to the adaptivity is not constraint by the original mesh.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 5A shows an exemplary local enrichment of an integration cell in accordance with one embodiment of the present invention.

DETAILED DESCRIPTION OF THE PREFERRED EMBODIMENTS

Figure 1A:
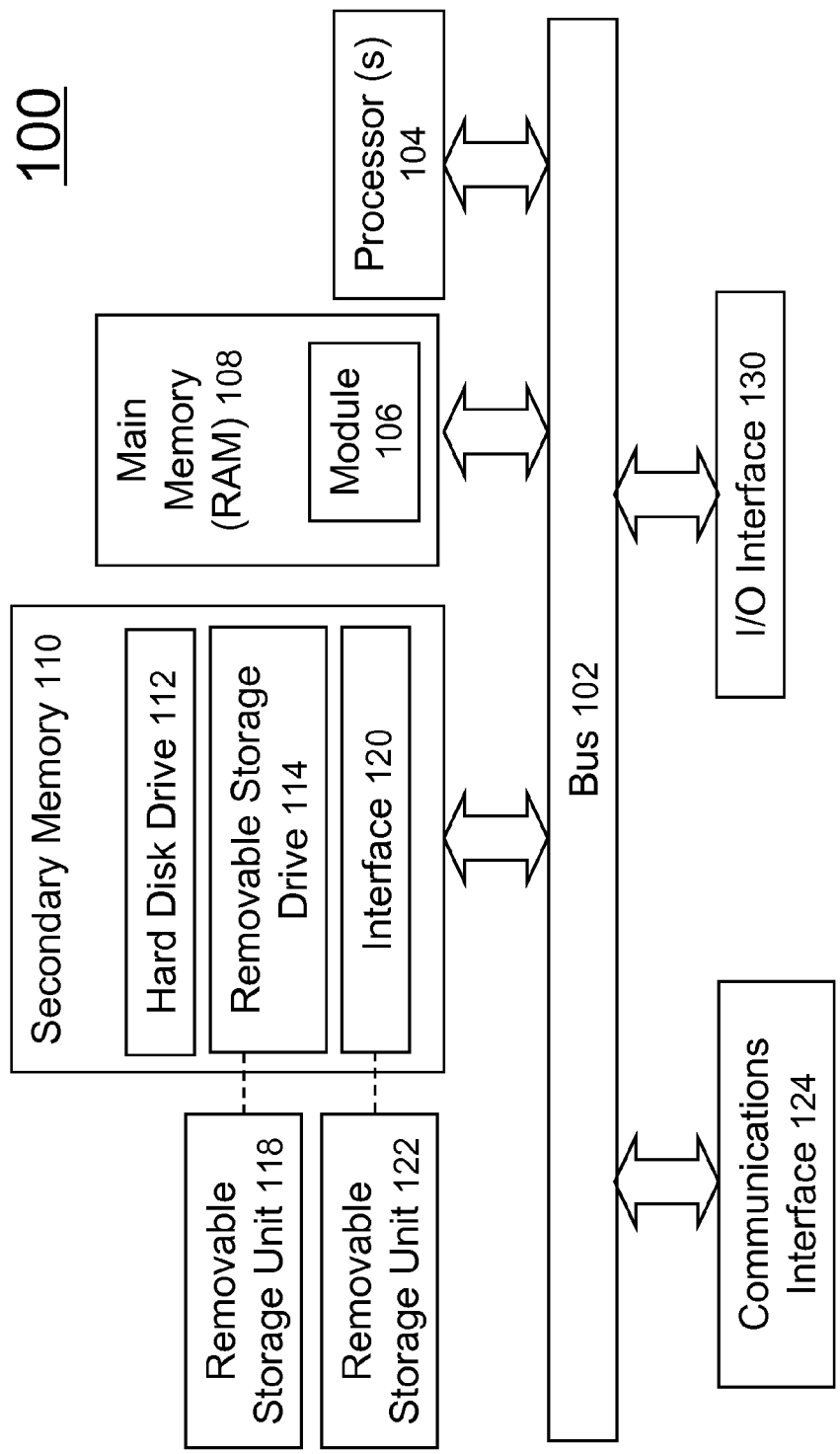
FIG. 1A depicts a block diagram of an exemplary computer, in which one embodiment of the present invention may be implemented.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

FEM stands for Finite Element Method, which is used interchangeably with FEA hereinafter.

CAE stands for Computer Aided Engineering.

Implicit FEA refers to $Ku=F$, where K is the effective stiffness matrix, u is the unknown displacement array and F is the effective loads array. F is a right hand side loads array while K is a left hand side stiffness matrix. The solution is performed at the global level with a factorization of the effective stiffness matrix, which is function of the stiffness, mass and damping. One exemplary solution method is the Newmark integration scheme.

Explicit analysis refers to $Ma=F$, where M is the diagonal mass array, a is the unknown acceleration array and F is the external loads array. The solution can be carried out at element level without factorization of a matrix. One exemplary solution method is called the central difference method.

Time domain analysis refers to an engineering analysis that simulates a physical phenomenon progressing in time. One of the solution methods for the time domain FEA is direct integration scheme, which may be carried out as either implicit or explicit solution schemes.

Total simulation time T refers to the real time being simulated in a time domain analysis.

Solution cycle and cycle are used interchangeably to refer to the numbered solution states starting with cycle 0 at time t=0.

The time step $\Delta t$ refers to an interval of time between subsequent cycles. For example, the first three solution cycles is at time t=0, $\Delta t$, and $2\Delta t$, respectively.

Essential boundary condition is defined such as the structural constraints on a model.

Shell and plate are used interchangeably hereinafter.

Node, node point and point are used interchangeably hereinafter.

Boundary and border are used interchangeably hereinafter.

Domain of influence and support of a node in the mesh-free model are used interchangeably hereinafter.

Reference mesh refers to the finite element mesh used in mesh-free analysis to map the 3-D structure onto a 2-D parametric plane.

An integration cell refers to the basic integration unit on the 2-D parametric plane and is corresponding to one of the elements in the finite element mesh.

Computer, computer system, and computing device are used interchangeably hereinafter.

Embodiments of the present invention are discussed herein with reference to FIGS. 1A-7D. However, those skilled in the art will readily appreciate that the detailed description given herein with respect to these figures is for explanatory purposes as the invention extends beyond these limited embodiments.

Referring now to the drawings, in which like numerals refer to like parts throughout several views. The present invention may be implemented using hardware, software or a combination thereof and may be implemented in a computer system or other processing system. In fact, in one embodiment, the invention is directed towards one or more computer systems capable of carrying out the functionality described herein. An example of a computer system 100 is shown in FIG. 1A. The computer system 100 includes one or more processors, such as processor 104. The processor 104 is connected to a computer system internal communication bus 102. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an EPROM, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services.

There may also be a communications interface 124 connecting to the bus 106. Communications interface 124 allows software and data to be transferred between computer system 100 and external devices. Examples of communications interface 124 may include a modem, a network interface (such as an Ethernet card), a communications port, a PCMCIA slot and card, etc.

The channel 126 facilitates a data flow 128 between a data network (e.g. 150 in FIG. 1B) and the computer 100 and typically executes a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer program medium" and "computer usable medium" are used to generally refer to media such as removable storage drive 114 and a hard disk installed in hard disk drive 112. These computer program products are means for providing software to computer system 100. The invention is directed to such computer program products.

The computer system 100 may also include an I/O interface 130, which provides the computer system 100 to access monitor, keyboard, mouse, printer, scanner, plotter, and a like.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform the features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

In another embodiment, the present invention is implemented primarily in hardware using, for example, hardware components such as application specific integrated circuits (ASICs). Implementation of the hardware state machine so as to perform the functions described herein will be apparent to persons skilled in the relevant art(s). In yet another embodiment, the present invention is implemented using a combination of both hardware and software.

The main memory 108 may be loaded with one or more application modules 106 that can be executed by one or more processors 104 with or without a user input through the I/O interface 130 to achieve desired tasks. In one embodiment, an application module is configured to facilitate calculating the mesh-free solution using a set of mathematical approximations of general 3-D shell structures with adaptive discretization. In another embodiment, the application module is configured to facilitate using the finite element domain of influence to calculate the shape function of newly adapted independent nodes. In yet another embodiment, the application module is configured to facilitate using the shape function of original nodes to calculate the shape function of the newly adapted constraint nodes. In operation, when at least one processor 104 executes one of the application modules 106, the results are computed and stored in the secondary memory 110 (i.e., hard disk drive 112). The status of the computation (e.g., the progress of a time-domain simulation) is reported to the user via the I/O interface 130. The current deformed structure may be shown graphically for visual inspection. The graphical output is sent through the I/O interface 130 to a monitor.

Figure 1B:
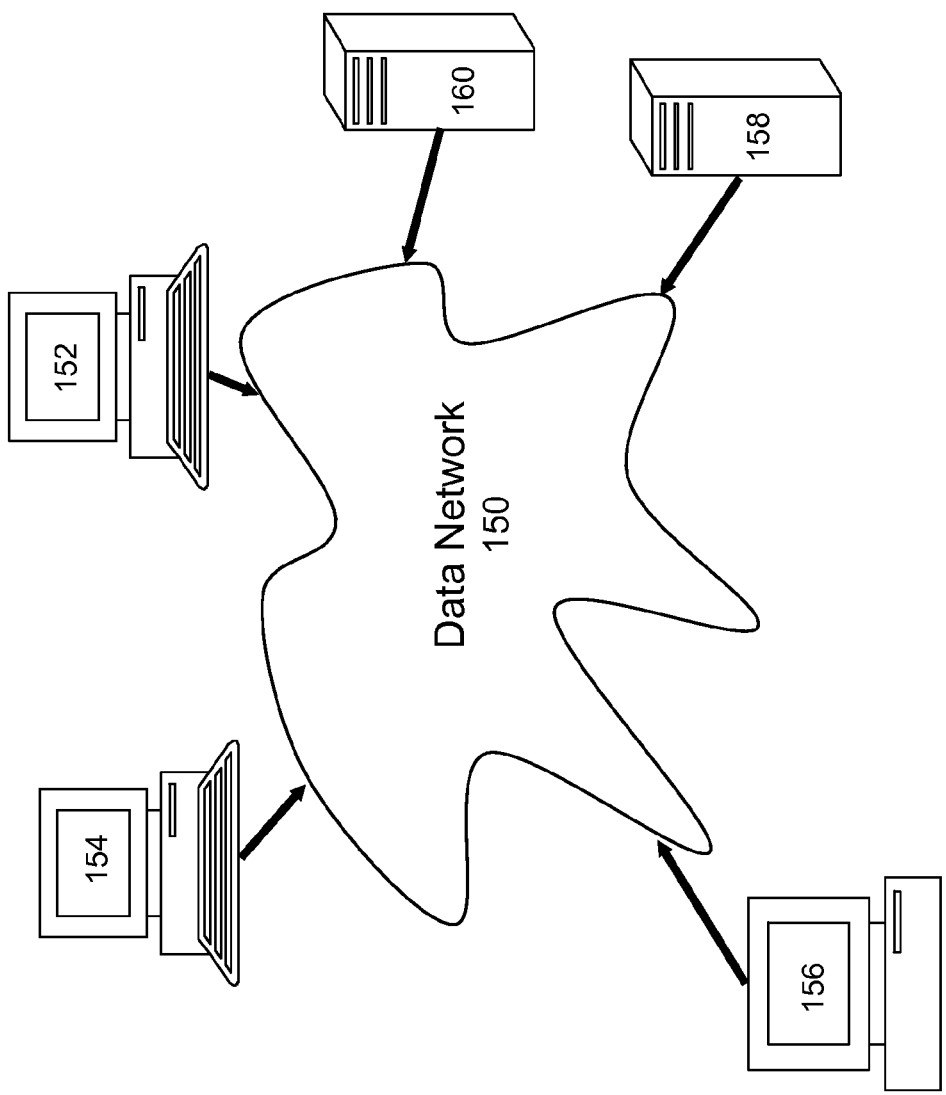
FIG. 1B depicts an exemplary network environment that another embodiment of the present invention may be implemented.

FIG. 1B depicts a networked computing environment 140, in which one embodiment of the present invention may be practiced. A plurality of network capable computing devices 152, 154, 156, 158 and 160 (e.g., the computer device 100 described in FIG. 1A) are coupled to a data network 150. These computing devices 152-160 can communicate with each other via the network 150. The data network 150 may include, but is not limited to, the Internet, an Intranet, local area network (LAN), wide area network (WAN), a wireless network or a data network comprises of public and private networks. In one embodiment, the application module (i.e., 106 in FIG. 1A) for the mesh-free analysis is configured and executed on the computing device 160. A user may prepare an input file describing the physical domain of an engineering problem on a personal workstation computing device 152. The input file is then sent to the computing device 160 via the network 150 to facilitate the computation of mesh-free analysis. During the execution of the application module, the user may be able to monitor the progress of the analysis at another computing device 156. Finally after the analysis is completed, the user may examine the computed results by retrieving the stored result file from the computer 160 to any one of the computing devices 152, 154 or 156 for a post-processing, which in general includes a graphical representation of the analysis results.

In one embodiment, the input file includes the description of the physical domain represented by a plurality of nodes in 3-D space. For a general 3-D shell structure, a background mesh such as FEA model may be used to represent the shell structure. The 3-D mesh is then mapped to a 2-D plane defined by a parametric coordinate system. Each of the elements in the background mesh corresponds to an integration cell in the 2-D parametric mesh. In a time domain analysis, either explicit or implicit scheme is chosen. Each of the projected nodes is assigned with a domain of influence or support. The mesh-free shape functions are modified to accommodate the essential boundary conditions for the particular analysis. Using mathematical approximations, the solution of the physical domain is calculated with the specific sequence of the instructions built within the application module (e.g., mesh-free analysis module) at each solution cycle. The analytical results such as shell thickness, nodal deformations are compared with those results from the previous solution cycle. When the differences of these error indicators exceed a predetermined threshold, a new adaptive discretization is generated based on the 2-D parametric plane. Only those integration cells exceeding the error threshold are refined. The solution continues with the new adaptive mesh for the next solution cycle until the total simulation time has been reached. In another embodiment, the adaptive refinement process divides a quadrilateral integration cell into four sub-cells by adding a new independent node in the centroid of the integration cell and by adding four constraint nodes at the mid-point of each sides of the integration cell. If the constraint node has already existed, a new independent node is created to replace the existing constraint node. If the neighboring cell has two-levels of refinement behind the integration cell to be adapted, the neighboring cell must be refined first.

Figure 2:
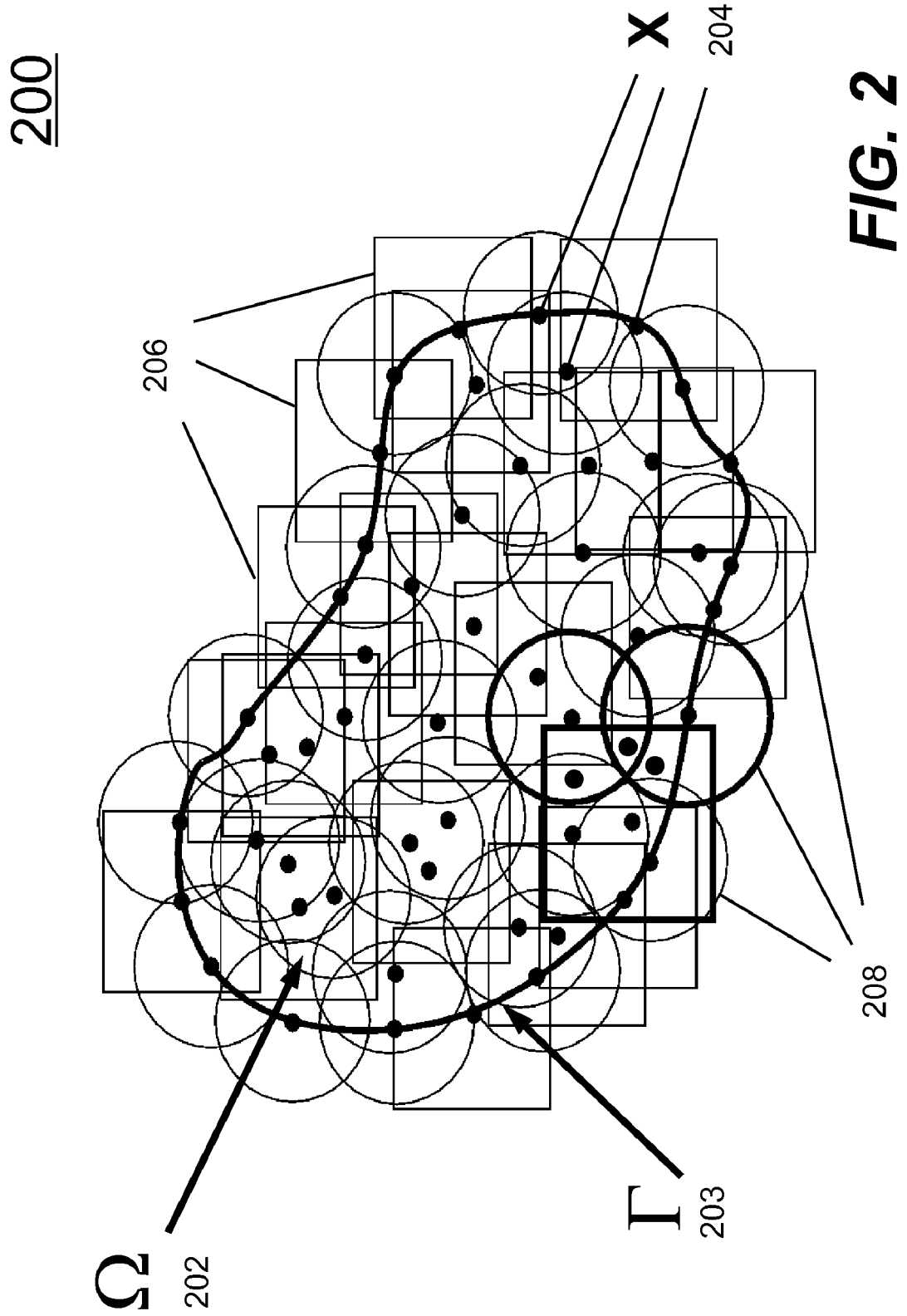
FIG. 2 shows an exemplary mesh-free analysis model in accordance with one embodiment of the present invention.

Referring now to FIG. 2, an exemplary mesh-free model 200 is shown in accordance with one embodiment of the present invention. An exemplary physical domain c 202, and the corresponding boundary or border r 203, are depicted in FIG. 2. To represent the physical domain 202, a plurality of nodes 204 are used. The nodes representing the physical domain do not have a particular pattern. They may be regularly spaced or in random locations. These nodes may be located in the interior or on the boundary of the physical domain. Each of the nodes 204 contains a domain of influence or support 206 and 208. The domain of influence and the support are used interchangeably hereinafter. The size and shape of the support for each node are also arbitrary. In one embodiment, the shape of the support is quadrilateral 206. In another embodiment, the shape is circular 208. In the case of three-dimensional support, the shape of the support may be spherical in that embodiment. In yet another embodiment, the size and the shape of each node are different. One node may have a one square foot support while another node may have a 16-in radius circular support in the same model. In yet another embodiment, the support is not a regular geometric shape. It can be any arbitrary shape. The present invention can support all different combinations.

In one embodiment, because of the flexibility of the present invention regarding the nodal representation 204 of the physical domain 202, a practical way to create a computer model for the mesh-free analysis is to use the FEA nodal data that is readily generated from a pre-processing software package. The FEA mesh of general 3-D shell structures is referred as the background mesh in a mesh-free analysis. The pre-processing software may be a stand-alone software package or a built-in portion of an engineering design or analysis computer program product package.

Figure 3:
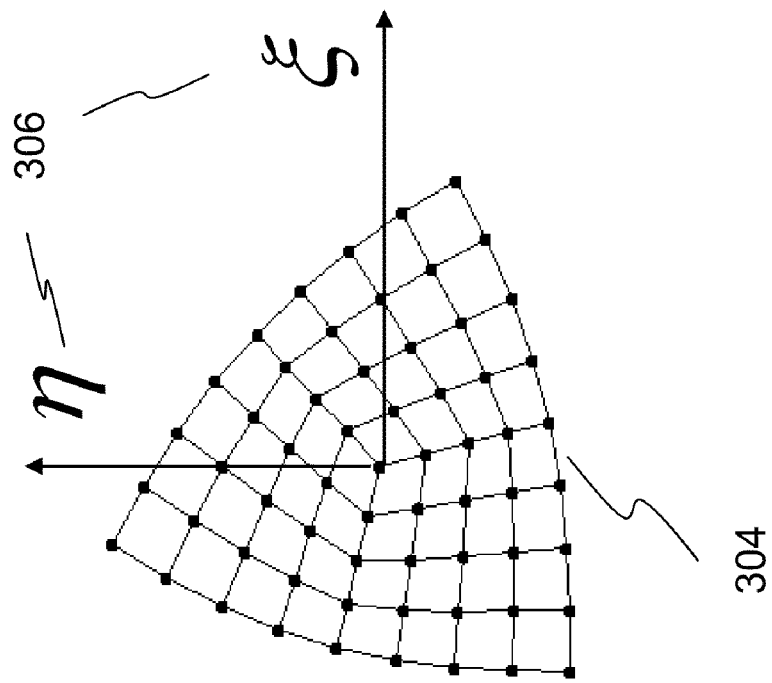
FIG. 3 shows the projection scheme of an exemplary three-dimensional shell structure into a two-dimensional parametric plane based on one embodiment of the present invention.
Figure 3:
Figure 3:
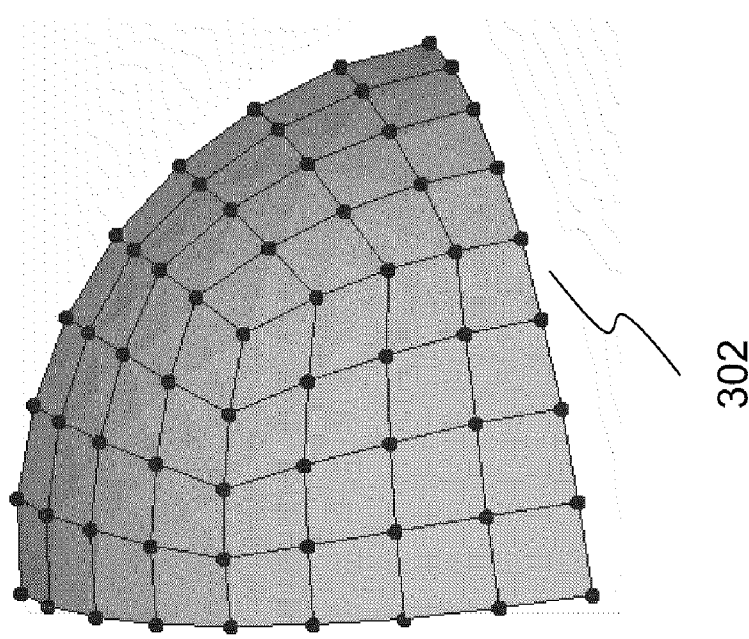

FIG. 3 illustrates a projection scheme used for mapping an exemplary 3-D shell structure into a 2-D parametric plane in a mesh-free analysis in accordance with the present invention. In one embodiment, a background mesh 302 of a curved 3-D shell structure is mapped to a 2-D parametric mesh 304 in a 2-D plane defined by a parametric coordinate system $(\eta, \xi)$ 306. The adaptive refinement in accordance with the present invention uses the 2-D parametric mesh as the original starting point.

Figure 4A:
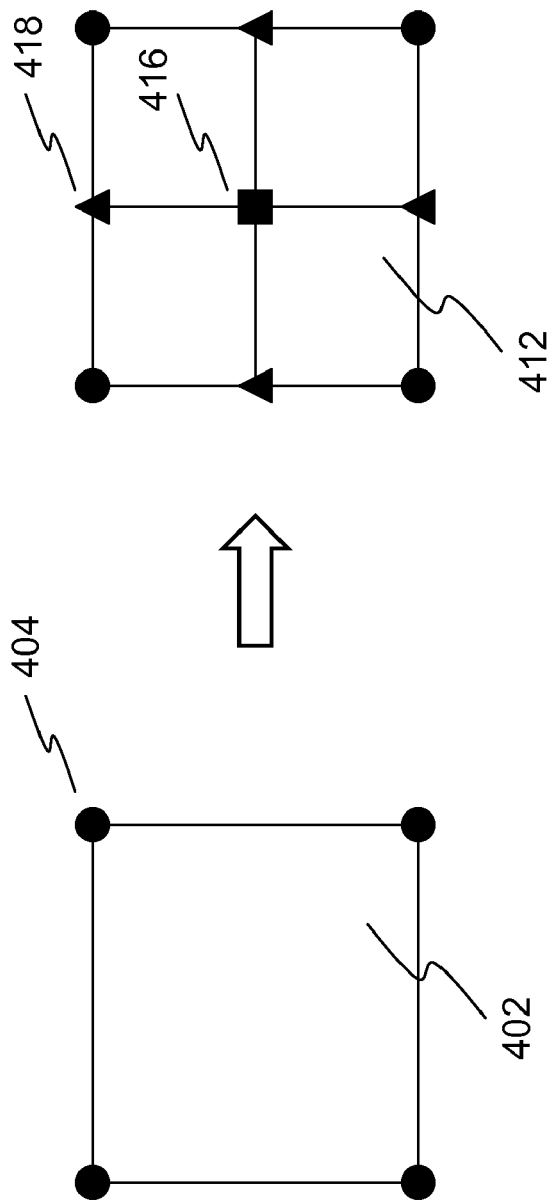
FIGS. 4A-C shows an exemplary adaptive scheme for an integration cell according to one embodiment of the present invention.
Figure 4B:
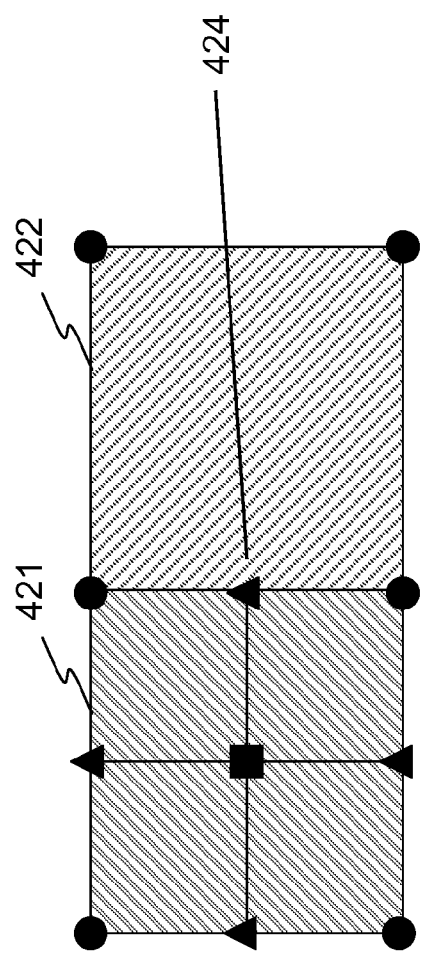
Figure 4B:
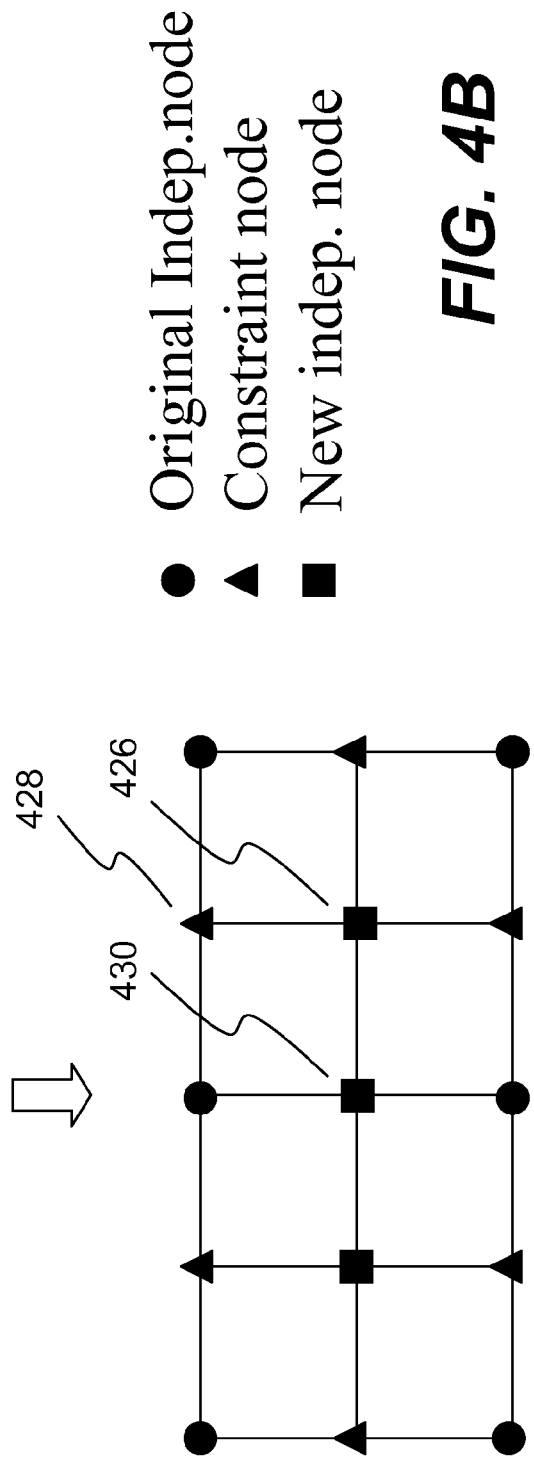
Figure 4C:
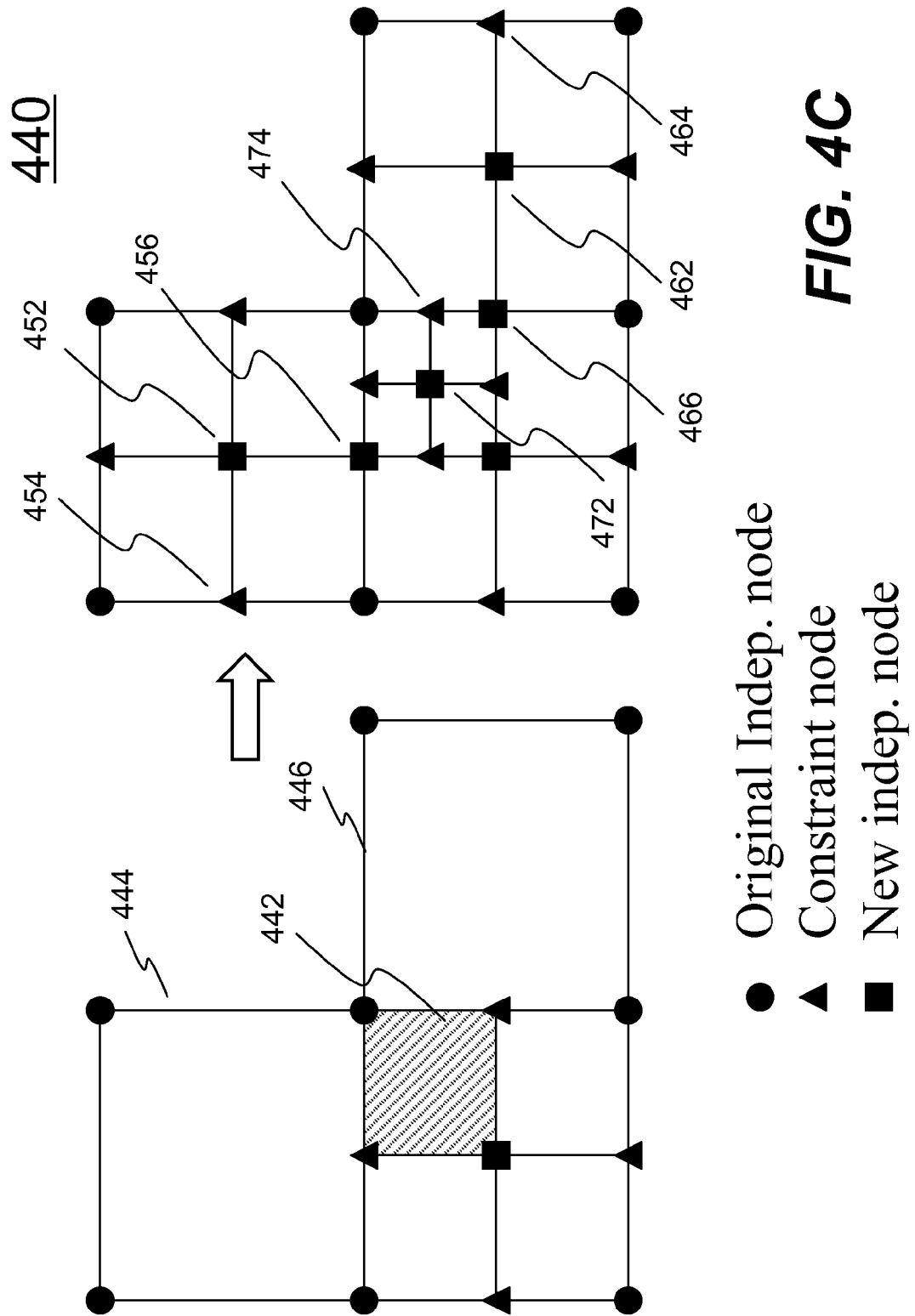

FIGS. 4A-C show exemplary adaptive schemes for an integration cell according to one embodiment of the present invention. In one embodiment, FIG. 4A shows an exemplary basic refinement scheme 400 for dividing an original quadrilateral integration cell (e.g., square cell 402) into four sub-cells 412. Each quadrilateral cell 402 has four corners referring to as four original independent nodes 404. These original independent nodes have full degrees-of-freedom and are represented as unknowns to be solved in a time-domain CAE analysis. The basic refinement scheme 400 is achieved by adding a new independent node 416 in the centroid of the original cell and four dependent constraint nodes 418 at the mid-point of each side of the original cell. The new independent nodes are assigned full degrees-of-freedom, while the constraint nodes are dependent nodes and do not have their own degrees-of-freedom. The motions of a constraint node are dictated by two end nodes of the side in which the constraint node is added.

FIG. 4B shows another embodiment of an exemplary refinement scheme 420, in which an original integration cell 422 being refined is next to an already refined cell 421. In this embodiment, there is a constraint node 424 locating between the cells 421 and 422. The significance of the constraint node 424 will be seen when we describe the process of refining the cell 422. Similar to scheme 400 in FIG. 4A, the scheme 420 divides the original cell 422 into four sub-cells by adding a new independent node 426 in the centroid and constraint nodes 428 at each side. The only difference is that the existing constraint node 424 is converted into an independent node 430 with full degrees-of-freedom.

FIG. 4C shows yet another embodiment of an exemplary refinement scheme 440, in which an original integration cell 442 being refined has been refined once and is next to two cells 444 and 446 that have not been refined at all. In this embodiment, the scheme 440 requires all neighboring cells must be in the same level of adaptivity before additional new refinement can be performed on the original cell 442. As a result of this scheme, the first step is to refine the two neighboring cells 444 and 446. New independent nodes 452 and 462 are added in the centroid, and a plurality of constraint nodes 454 and 464 are added to each side of the cell 444 and 446, respectively. Based on the scheme 420 in FIG. 4B, the existing constraint nodes 456 and 466 are converted into new independent nodes. Then, the cell 442 can be divided into four sub-cells based on the scheme 400 as shown in FIG. 4A. A new node 472 is added in the centroid, and four constraint nodes 474 at the mid-point of each side of the cell 442.

FIG. 5A shows an exemplary local enrichment of an integration cell after the adaptive refinement in accordance to an embodiment of the present invention. In the embodiment, there are nine original independent nodes N1, N2, N3, N4, N5, N6, N7, N8 and N9 in the original model. After an adaptive refinement to an integration cell Ω502 defined by four corner nodes N1, N2, N3 and N4, a new independent node N10 and four constraint nodes C1, C2, C3 and C4 are added to the integration cell Ω502. As a result, the original cell 502 is divided into four sub-cells (e.g., sub-cell $\Omega_{C1}$ 504). The shape functions must be evaluated at all newly added nodes within the integration cell Ω502. The nodes include added nodes N10, C1, C2, C3 and C4. The shape function for the constraint nodes is defined as:

$$\Phi_I(X_{C1}) = \frac{1}{2}[\Phi_I(X_{N1}) + \Phi_I(X_{N2})] \tag{1}$$

where C1 is the constraint node, and N1 and N2 are the end nodes that form one side of the original integration cell.

The shape function for the new independent node N10 is calculated as follows:

$$X^a(X) = \Theta\left[\sum_{I=1}^{NP} \Psi_I(X)X_I + \overline{\Psi}_J(X)X_J\right], X \in \Omega_{C1} \tag{2}$$

where Θ is the mesh-free operator, Ψ is the window function of the original node I, $\overline{\Psi}_J$ is the finite element shape function of the new node J (e.g., Node N10). The nodal forces at original and new independent nodes can then be calculated and transformed to the physical nodal forces. In finite element analysis, the nodal forces at the constraint nodes must be calculated and then redistributed to the independent nodes, while the nodal forces at the constraint nodes are not calculated in the adaptive mesh-free analysis. After the stresses and internal variables have been transferred to the nodes, these values will be recovered at the new stress points on the newly refined adaptive discretization using the newly constructed mesh-free shape functions and the continuity will be ensured. For example, the new stresses can be obtained using the expression $$\sigma = N\overline{\sigma}^* \tag{3}$$

where $\overline{\sigma}$ are the smoothed nodal stresses using a weighted averaging given by $$\overline{\sigma}^{*j} = \sum_{I=1}^{IE} w_I \sigma_I^j \tag{4}$$

where $\overline{\sigma}^{*j}$ is the j-th component of the smoothed nodal stresses, $\sigma_I^j$ is the j-th component of the local stress evaluated at the stress point of co-rotation plane $I_1$ and $w_I$ is the weight.

Figure 5B:
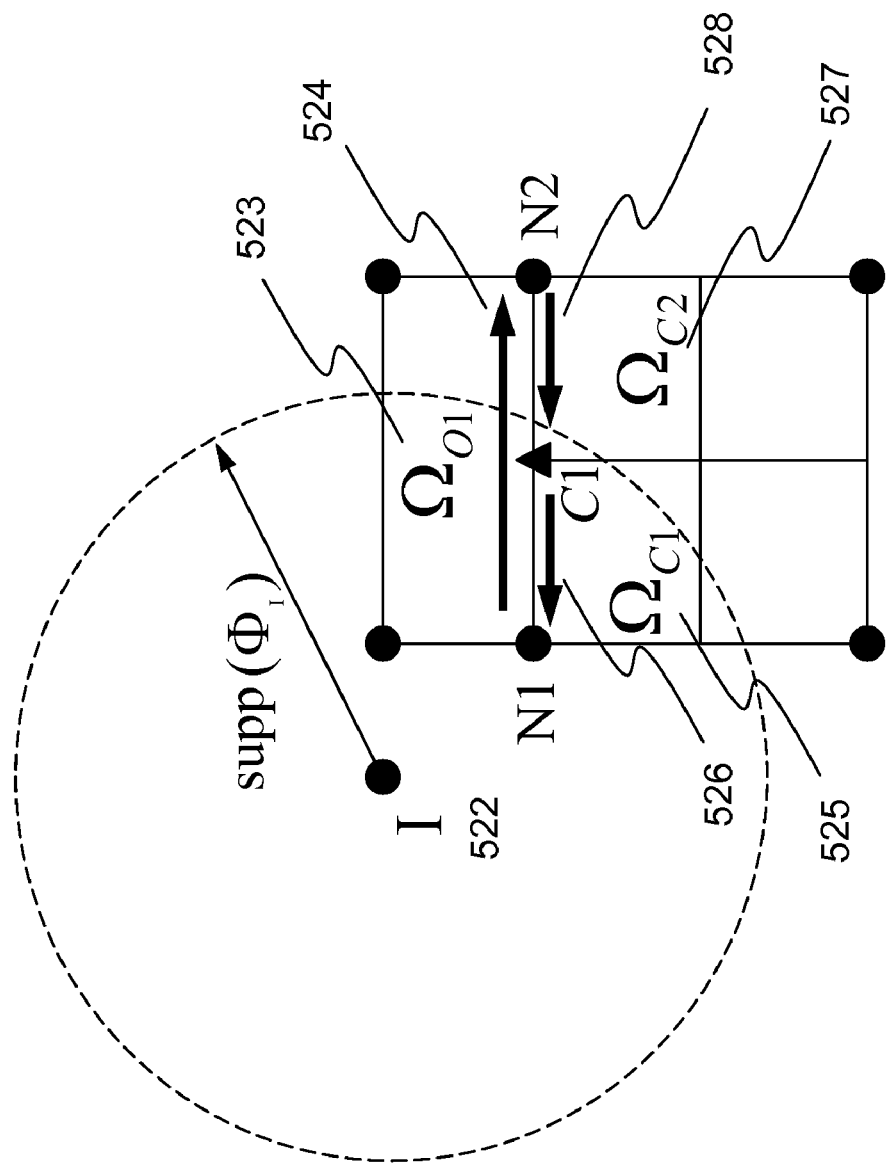
FIG. 5B shows an exemplary integration scheme in accordance with one embodiment of the present invention.

FIG. 5B shows an exemplary integration scheme 520 in accordance with one embodiment of the present invention. In the mesh-free analysis, the local enrichment in the adaptive refinement not only improves the computational efficiency, it also enforces the integration constraint during the mesh-free adaptive procedure. The condition for interior node I 522 to exactly satisfy the integration constraint is $$\sum_L \int_{\Gamma_L} \Phi_I(X) n_i(X) d\Gamma = 0 \tag{5}$$

In FIG. 5B, the above equation is equivalent to $$\int_{\Gamma_{N1N2}} \Phi_I(X) n_i^+(X) d\Gamma + \tag{6}$$

$$\int_{\Gamma_{C1N1}} \Phi_I(X) n_i^-(X) d\Gamma + \int_{\Gamma_{N2C12}} \Phi_I(X) n_i^-(X) d\Gamma = 0$$

with $n_i^+ = -n_i^-$ where $\Phi_I(X)$ is the support or domain of influence of the node I, $\Gamma_{N1N2}$ 524 is the boundary defined by node N1 to N2 of domain $\Omega_{O1}$ 523, $\Gamma_{C1N1}$ 526 is the boundary defined by node C1 to N1 of domain $\Omega_{C1}$ 525, and $\Gamma_{N2C1}$ 528 is the boundary defined by node N2 to C1 of domain $\Omega_{C2}$ 527. For a two-point trapezoidal rule, this leads to the same shape functions as shown in equation (1).

Figure 6A:
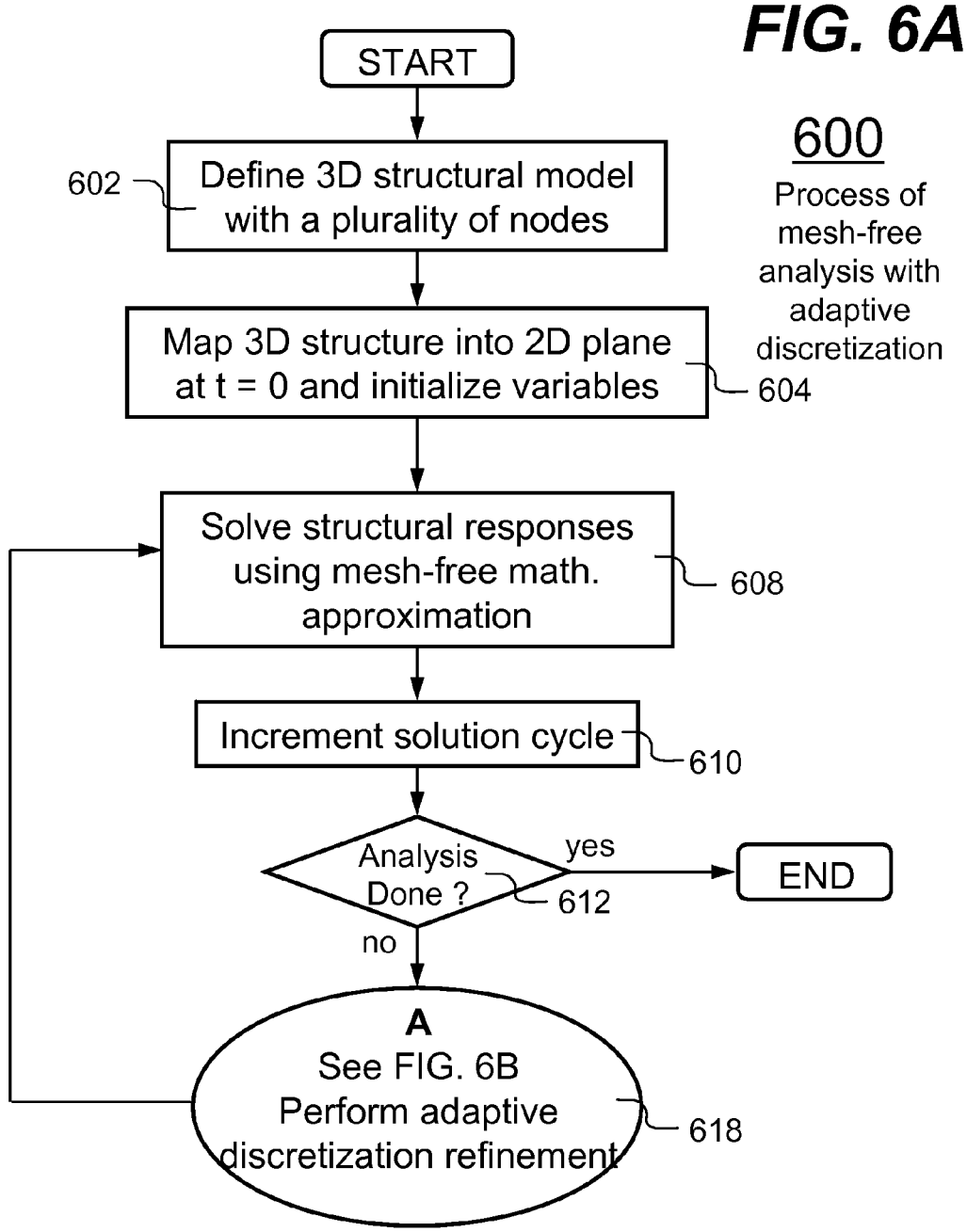
FIG. 6A shows a flowchart or process of an exemplary 3-D mesh-free shell structure with an adaptive discretization in accordance with one embodiment of the present invention.

Referring now to FIG. 6A, a flowchart or process 600 of implementing mesh-free analysis with adaptive discretization is shown in accordance with one embodiment of the present invention. The process 600, which is preferably understood in conjunction with FIG. 3, may be implemented in software, hardware, or a combination of both. In this embodiment, the process 600 defines a 3-D structural model or physical domain with a plurality of nodes at 602. For an exemplary 3-D shell structure, a finite element geometry description can be used to for nodal definition and reference mesh. At 604, the 3-D reference mesh is mapped to a 2-D plane defined by a parametric coordinate system (η,ξ) 306 as shown in FIG. 3. The 2-D parametric model includes a plurality of integration cells, which corresponds to each of the quadrilateral elements in the reference finite element mesh. All of the nodal displacements, velocities and accelerations are initialized in the beginning of the time-domain analysis (i.e., solution cycle 0 or time t=0). Depending upon explicit or implicit analysis, the time step Δt and integration parameters are chosen at 604 also. At 608, the process 600 starts marching through time to simulate the 3-D structure under a loading condition by solving partial differentiation equations that describe the structural responses using mesh-free mathematical approximations in the 2-D parametric plane. At 610, the solution time t is incremented (i.e., t=t+Δt). Then the process 600 determines whether the solution time t has exceeded the pre-determined the total simulation time T at 612. If the test at 612 is true, the total simulation time has reached and the process 600 ends. Otherwise, the process 600 moves to 618 to perform adaptive discretization refinement, then the process 600 moves back to 608 to solve the structural responses at the next solution cycle. The process 600 repeats until it reaches the total simulation time.

Figure 6B:
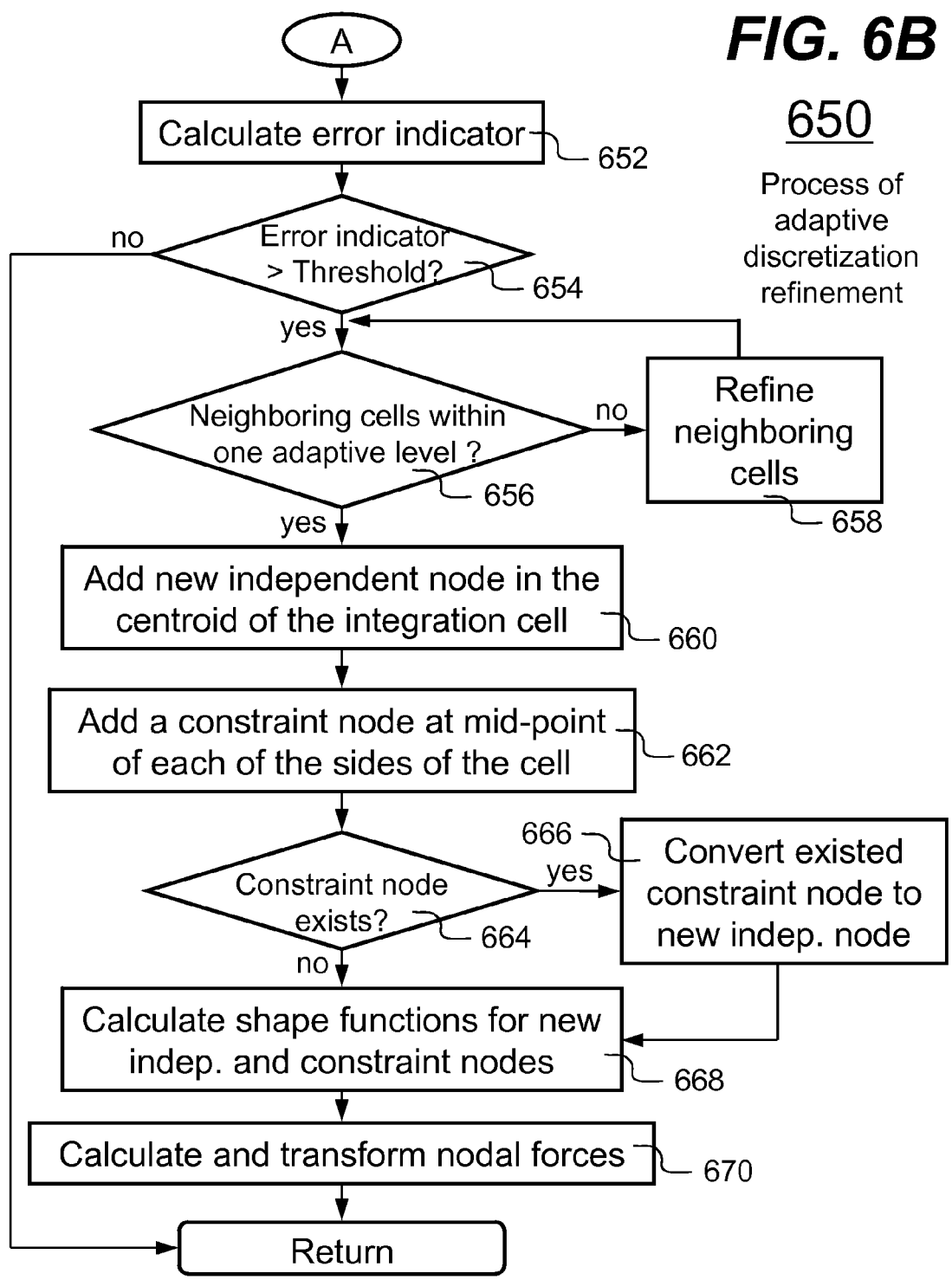
FIG. 6B shows the projection scheme of an exemplary model refinement of an integration cell in accordance with one embodiment of the present invention.

FIG. 6B shows a flowchart or process 650 of implementing adaptive discretization refinement (i.e., 618 in FIG. 6A) in accordance with one embodiment of the present invention. The process 650, which is preferably understood in conjunction with previous figures especially with FIGS. 4A-C and 6A, may be implemented in software, hardware, or a combination of both. At 652, the process 650 calculates a plurality of error indicators between solution cycles. The error indicators may include, but not limited to, thickness change, angle change, or strain change for each of the integration cells. At 654, the error indicator is compared to a predetermined user specified threshold value for each of the integration cells. When the error indicator for all of the integration cells is within the threshold value (i.e., the test 654 is not true), the process 650 does not perform the adaptive discretization refinement. The process returns to the beginning of the solution phase (608 in FIG. 6A) for the next solution cycle. When the test 654 is true for any one of the integration cells, the process 650 will perform the adaptive discretization refinement for those integration cells with error indicator exceeding the threshold value, one integration cell at a time. At 656, the process 650 checks the adaptive level of all of the neighboring cells relative to that of the integration cell to be refined. When any one of the neighboring cells is more than one adaptive level behind, at 658, the process 650 first refines those neighboring cells to make sure that the adaptive level of all of the neighboring cells are within one level of the integration cell to be refined (e.g., FIG. 4C). Then the process 650 moves to 660, in which a new independent node is added to the centroid of the integration cell to be refined. At 662, process 650 adds one constraint node at the mid-point of each of the sides of the integration cell to be refined as shown in FIG. 4A. At 664, for each of the added constraint nodes, the process 650 checks if there is a constraint node already existed. If not, the process 650 will move to 668. If yes, the process 650 converts the duplicated constraint nodes to become another new independent node at 666 (e.g., FIG. 4B) before moving to 668. At 668, the process 650 reconstructs shape functions for all of the new independent nodes and constraint nodes. In one embodiment, the domain of influence of the new independent node is within the integration cell. At 670, the nodal force can be calculated with the reconstructed shape functions and those forces are transformed to the global coordinate system for the time domain analysis. Then the process 650 returns to the beginning of the next solution cycle.

Because of the higher-order characteristics of the mesh-free approximation, the adaptive mesh-free shell can provide more accurate solutions to the numerical analysis of shell structures. In addition, mesh-free analysis does not require the mesh to construct the shape functions. Therefore, the shape functions are naturally conforming and no constraint of compatibility is required. The adaptive mesh-free shell can also fit more accurately to the real surface than the bi-linear quadrilateral finite elements. The importance of this geometrical accuracy provided by the higher-order adaptivity can be shown by a tube bending problem as shown in FIGS. 7A-D.

Figure 7A:
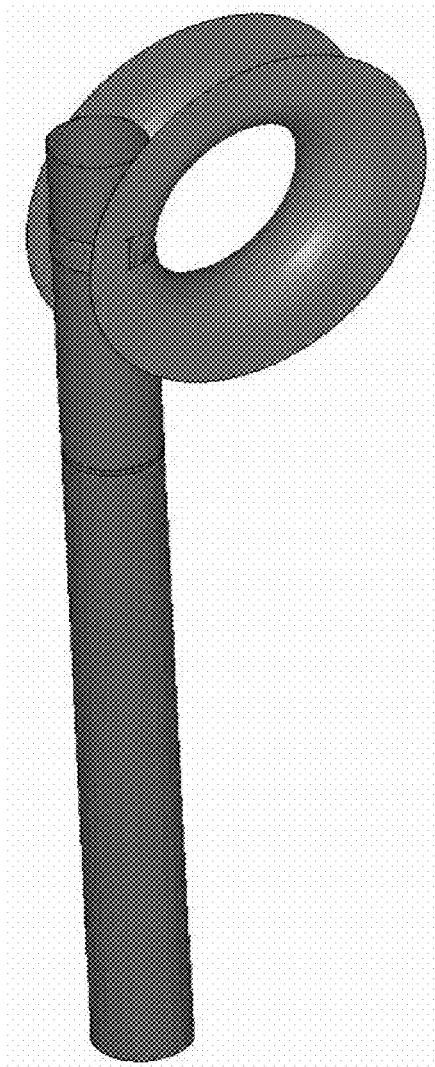
FIG. 7A shows an exemplary tube bending problem using 3-D shell structure model.
Figure 7B:
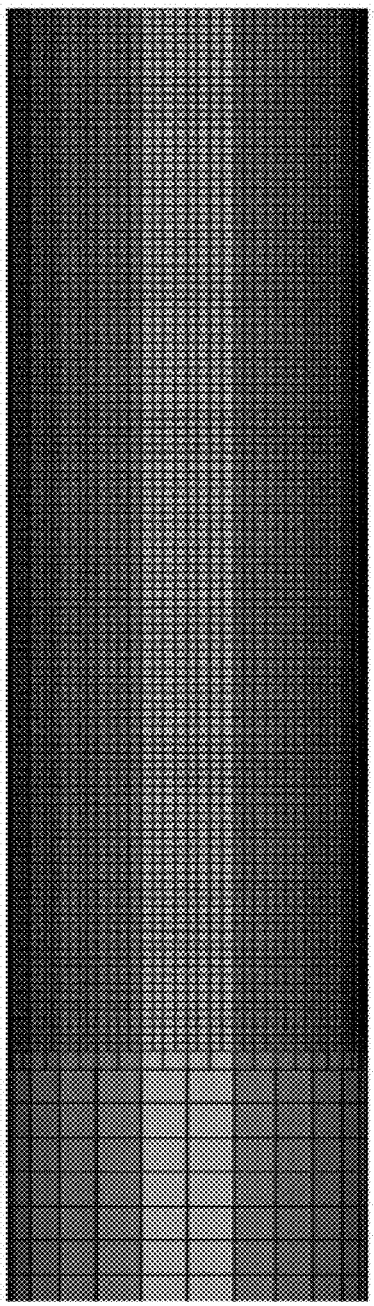
FIG. 7B shows an exemplary adaptive discretization of the tube of the problem in FIG. 7A.
Figure 7C:
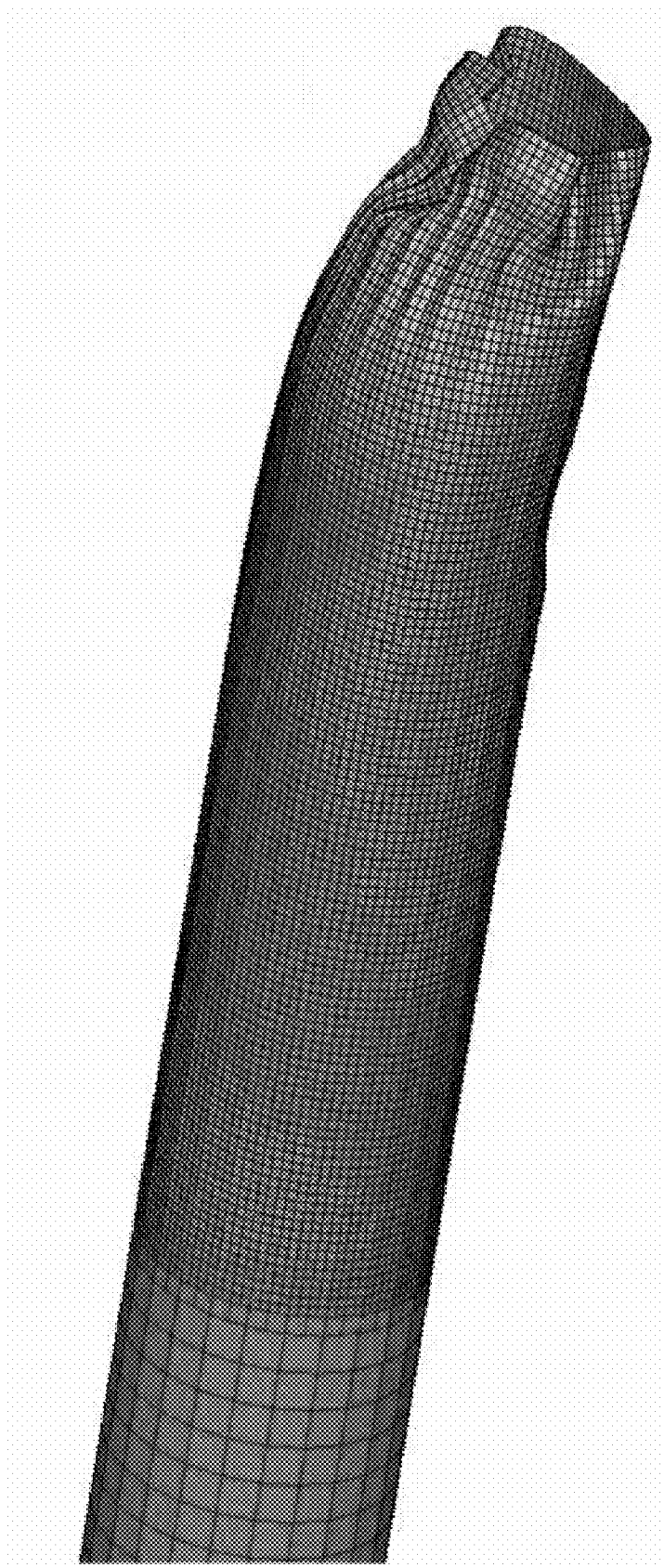
FIG. 7C shows the graphical display of the deformed tube of the problem in FIG. 7A using linear adaptivity in FEA.
Figure 7D:
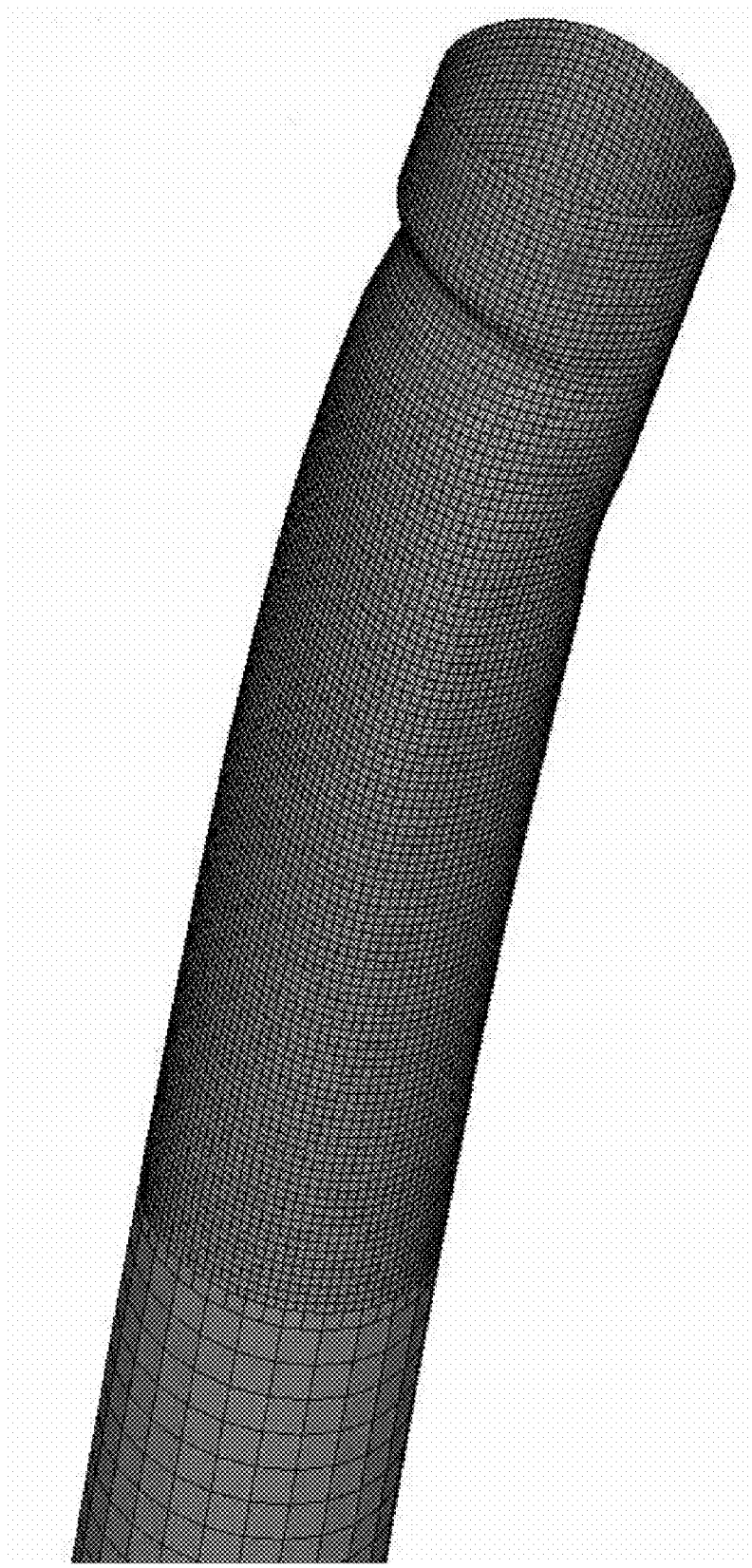
FIG. 7D shows an exemplary graphical display of the deformed tube of the problem in FIG. 7A using curved adaptivity in accordance with one embodiment of the present invention.

FIG. 7A illustrates a cylindrical tube bended by a rigid ring. FIG. 7B shows that the cylindrical tube is initially discretized by a coarse mesh (e.g., 24 elements along the circumference) and the right part of the mesh, which will undergo the deformation, is refined with two levels of uniform adaptivity. Two adaptivity schemes are compared. The first scheme is based on a linear adaptivity used in finite element analysis, in which a quadrilateral element is divided into four sub-elements that are in the same plane as the original element. The surface defined by the adaptive mesh with the linear adaptivity depends on the original mesh, which is a polygonal surface. The second scheme is called curved adaptivity used in mesh-free analysis, in which the added nodes of the adaptive discretization are on the cylindrical surface. The adaptive surface is more closely fit to the cylindrical tube. The structural behaviors of the cylindrical tube are quite different using these two schemes. FIG. 7C shows the results from the linear adaptivity, in which the polygon surface generated from the linear adaptivity is stiffer in deformation and leads to wrinkling whose patterns depending upon the original mesh. FIG. 7D shows the results from the curved adaptivity, in which the smooth deformation is clearly displayed.

Although an exemplary embodiment of invention has been disclosed, it will be apparent to those skilled in the art that various changes and modifications may be made to achieve the advantage of the invention. It will be obvious to those skilled in the art that some components may be substituted with another component providing same function. The appended claims cover the present invention.

What is claimed is:

1. A computer-implemented method of conducting a time-domain simulation of a shell structure using mesh-free analysis with adaptive discretization refinement, the method comprising:

defining, in a computer, the shell structure by a structural geometry description file including a plurality of nodes and a reference three-dimensional (3-D) mesh, wherein the 3-D mesh includes a plurality of shell elements;

mapping the 3-D reference mesh into a two-dimensional (2-D) parametric mesh in the computer, wherein the 2-D parametric mesh includes a plurality of integration cells, each of which corresponds to one of the plurality of shell elements;

solving structural responses at current solution cycle of the time-domain simulation in the computer using mesh-free mathematical approximations pertaining to each of the plurality of integration cells;

incrementing, in the computer, current solution cycle time by a predetermined time step to determine whether the time-domain simulation has reached a predefined total simulation time;

when the time-domain simulation has not reached the total simulation time, performing adaptive discretization refinement for the plurality of the integration cells; otherwise displaying the structural responses of the time-domain simulation in a monitor coupling to the computer as desired; and said performing adaptive discretization refinement further comprising:

calculating an error indicator for each of the integration cells;

dividing the integration cells into a first group and a second group, wherein the error indicator of each integration cells of the first group is above a threshold value and the error indicator of each integration cells of the second group is below the threshold value;

skipping the adaptive discretization refinement for the second group; and refining those integration cells in the first group.

2. The method of claim 1, wherein the structural geometry description file includes a plurality of nodes and a reference mesh from a finite element analysis model.

3. The method of claim 2, wherein the finite element analysis model is retrieved in form of data packets over a network.

4. The method of claim 2, wherein the shell elements are quadrilateral elements.

5. The method of claim 1, said refining those integration cells in the first group further comprising:

adding a first new independent node in centroid of each of said those integration cells; and adding a plurality of constraint nodes at mid-point of each side of said each of said those integration cells.

6. The method of claim 5, further comprising:

reconstructing shape functions for the first new independent nodes and the plurality of constraint nodes; and calculating nodal forces using the reconstructed shape functions.

7. The method of claim 5, said adding a plurality of constraint nodes further comprises converting the existing constraint node to a second new independent node, when the constraint node exists.

8. The method of claim 1, further comprising ensuring all neighboring cells of each of the cells in the first group having same adaptivity level.

9. The method of claim 8, further comprising refining each of the neighboring cells with one lower adaptivity level by adding a new independent node in centroid of each of the neighboring cells and by adding a plurality constraint nodes at mid-point of each side of said each of the neighboring cells.

10. A computer program product including a computer usable medium having computer readable code embodied in the medium for causing an application module to execute on a computer for conducting a time-domain simulation of a shell structure using mesh-free analysis with adaptive discretization refinement, the computer program product comprising:

computer readable code for defining the shell structure by a structural geometry description file including a plurality of nodes and a reference three-dimensional (3-D) mesh, wherein the 3-D mesh includes a plurality of shell elements;

computer readable code for mapping the 3-D reference mesh into a two-dimensional (2-D) parametric mesh, wherein the 2-D parametric mesh includes a plurality of integration cells, each of which corresponds to the plurality of shell elements;

computer readable code for solving structural responses at current solution cycle using mesh-free mathematical approximations pertaining to each of the plurality of integration cells;

computer readable code for incrementing current solution cycle time by a predetermined time step to determine whether the time-domain simulation has reached a predefined total simulation time; when the time-domain simulation has not reached the total simulation time, performing adaptive discretization refinement for the plurality of the integration cells; otherwise displaying the structural responses of the time-domain simulation in a monitor coupling to the computer as desired; and said computer readable code for performing adaptive discretization refinement further comprising:

computer readable code for calculating an error indicator for each of the integration cells;

computer readable code for dividing the integration cells into a first group and a second group, wherein the error indicator of each integration cells of the first group is above a threshold value and the error indicator of each integration cells of the second group is below the threshold value;

computer readable code for skipping the adaptive discretization refinement for the second group; and computer readable code for refining those integration cells in the first group.

11. The computer program product of claim 10, wherein the structural geometry description file includes a plurality of nodes and a reference mesh from a finite element analysis model.

12. The computer program product of claim 10, said computer readable code for refining those integration cells in the first group further comprising:

computer readable code for adding a first new independent node in centroid of each of said those integration cells; and computer readable code for adding a plurality of constraint nodes at mid-point of each side of said each of said those integration cells.

13. The computer program product of claim 12, further comprising:

computer readable code for reconstructing shape functions for the first new independent nodes and the plurality of constraint nodes; and computer readable code for calculating nodal forces using the reconstructed shape functions.

14. The computer program product of claim 12, said computer readable code for adding a plurality of constraint nodes further comprises computer readable code for converting the existing constraint node to a second new independent node, when the constraint node exists.

15. The computer program product of claim 10, further comprising computer readable code for ensuring all neighboring cells of each of the cells in the first group having same adaptivity level.

16. The computer program product of claim 15, further comprising computer readable code for refining each of the neighboring cells with one lower adaptivity level by adding a new independent node in centroid of each of the neighboring cells and by adding a plurality constraint nodes at mid-point of each side of said each of the neighboring cells.

17. A system for conducting a time-domain simulation of a shell structure using mesh-free analysis with adaptive discretization refinement, the system comprising:

an I/O interface;

a communication interface;

a secondary memory;

a main memory for storing computer readable code for an application module;

at least one processor coupled to the main memory, the secondary memory, the I/O interface, and the communication interface, said at least one processor executing the computer readable code in the main memory to cause the application module to perform operations of: defining the shell structure by a structural geometry description file including a plurality of nodes and a reference three-dimensional (3-D) mesh, wherein the 3-D mesh includes a plurality of shell elements;

mapping the 3-D reference mesh into a two-dimensional (2-D) parametric mesh, wherein the 2-D parametric mesh includes a plurality of integration cells, each of which corresponds to the plurality of shell elements;

solving structural responses at current solution cycle using mesh-free mathematical approximations pertaining to each of the plurality of integration cells;

incrementing current solution cycle time by a predetermined time step to determine whether the time-domain simulation has reached a predefined total simulation time;

when the time-domain simulation has not reached the total simulation time, performing adaptive discretization refinement for the plurality of the integration cells; otherwise displaying the structural responses of the time-domain simulation in a monitor coupling to the computer as desired; and said performing adaptive discretization refinement further comprising:
  calculating an error indicator for each of the integration cells;
  dividing the integration cells into a first group and a second group, wherein the error indicator of each integration cells of the first group is above a threshold value and the error indicator of each integration cells of the second group is below the threshold value;
  skipping the adaptive discretization refinement for the second group; and
  refining those integration cells in the first group.

18. The system of claim 17, said refining those integration cells in the first group further comprising:
  adding a first new independent node in centroid of each of said those integration cells;
  adding a plurality of constraint nodes at mid-point of each side of said each of said those integration cells;
  reconstructing shape functions for the first new independent nodes and the plurality of constraint nodes; and
  calculating nodal forces using the reconstructed shape functions.

19. The system of claim 18, said adding a plurality of constraint nodes further comprises converting the existing constraint node to a second new independent node, when the constraint node exists.

20. The system of claim 17, further comprising ensuring all neighboring cells of each of the cells in the first group having same adaptivity level.

21. The system of claim 20, further comprising refining each of the neighboring cells with one lower adaptivity level by adding a new independent node in centroid of each of the neighboring cells and by adding a plurality constraint nodes at mid-point of each side of said each of the neighboring cells.

* * * * *